(12) United States Patent
Kong

(10) Patent No.: US 12,408,263 B2
(45) Date of Patent: Sep. 2, 2025

(54) DIFFERENTIAL PAIR INNER-SIDE IMPEDANCE COMPENSATION

(71) Applicant: Dell Products L.P., Round Rock, TX (US)

(72) Inventor: Lingyu Kong, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 579 days.

(21) Appl. No.: 17/746,135

(22) Filed: May 17, 2022

(65) Prior Publication Data

US 2023/0345625 A1    Oct. 26, 2023

(30) Foreign Application Priority Data

Apr. 20, 2022    (CN) .......................... 202210419504.1

(51) Int. Cl.
  *H05K 1/02*    (2006.01)
(52) U.S. Cl.
  CPC ........... *H05K 1/0245* (2013.01); *H05K 1/025* (2013.01); *H05K 2201/09236* (2013.01)
(58) Field of Classification Search
  CPC ................. H05K 1/0245; H05K 1/025; H05K 2201/09236; H05K 2201/0776; H05K 1/0216; H05K 1/0228; H01P 3/02; H01P 3/04
  See application file for complete search history.

(56) References Cited

U.S. PATENT DOCUMENTS

| | | | |
|---|---|---|---|
| 2003/0179049 A1* | 9/2003 | Goergen | H05K 1/116 333/28 R |
| 2015/0282300 A1* | 10/2015 | Kagaya | H05K 1/0245 398/135 |
| 2020/0092986 A1 | 3/2020 | Chandra et al. | |
| 2020/0253036 A1 | 8/2020 | Chandra et al. | |
| 2020/0267833 A1* | 8/2020 | Lou | H01P 3/08 |
| 2020/0375025 A1* | 11/2020 | Kim | H05K 1/0245 |

\* cited by examiner

*Primary Examiner* — Timothy J Thompson
*Assistant Examiner* — Paramita Ghosh
(74) *Attorney, Agent, or Firm* — Larson Newman, LLP

(57) ABSTRACT

An information handling system includes first and second differential pairs on a printed circuit board. The first differential pair includes first and second traces, and first and second sets of impedance compensation traces. The first impedance compensation traces are routed only on an inner-side of the first trace. The second impedance compensation traces are routed only on an inner-side of the second trace, and the first and second impedance compensation traces are substantially aligned. The second differential pair includes third and fourth traces and third and fourth sets of impedance compensation traces. The third set of impedance compensation traces are routed only on an inner-side of the third trace. The fourth impedance compensation traces are routed only on an inner-side of the fourth trace, and the third and fourth impedance compensation traces are substantially aligned.

17 Claims, 6 Drawing Sheets

US 12,408,263 B2

DIFFERENTIAL PAIR INNER-SIDE IMPEDANCE COMPENSATION

FIELD OF THE DISCLOSURE

The present disclosure generally relates to information handling systems, and more particularly relates to differential pair inner-side impedance compensation.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes first and second differential pairs on a printed circuit board. The first differential pair includes first and second traces, and first and second sets of impedance compensation traces. The first impedance compensation traces may be routed only on an inner-side of the first trace. The second impedance compensation traces may be routed only on an inner-side of the second trace, and the first and second impedance compensation traces may be substantially aligned. The second differential pair includes third and fourth traces and third and fourth sets of impedance compensation traces. The third set of impedance compensation traces may be routed only on an inner-side of the third trace. The fourth impedance compensation traces may be routed only on an inner-side of the fourth trace, and the third and fourth impedance compensation traces may be substantially aligned.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
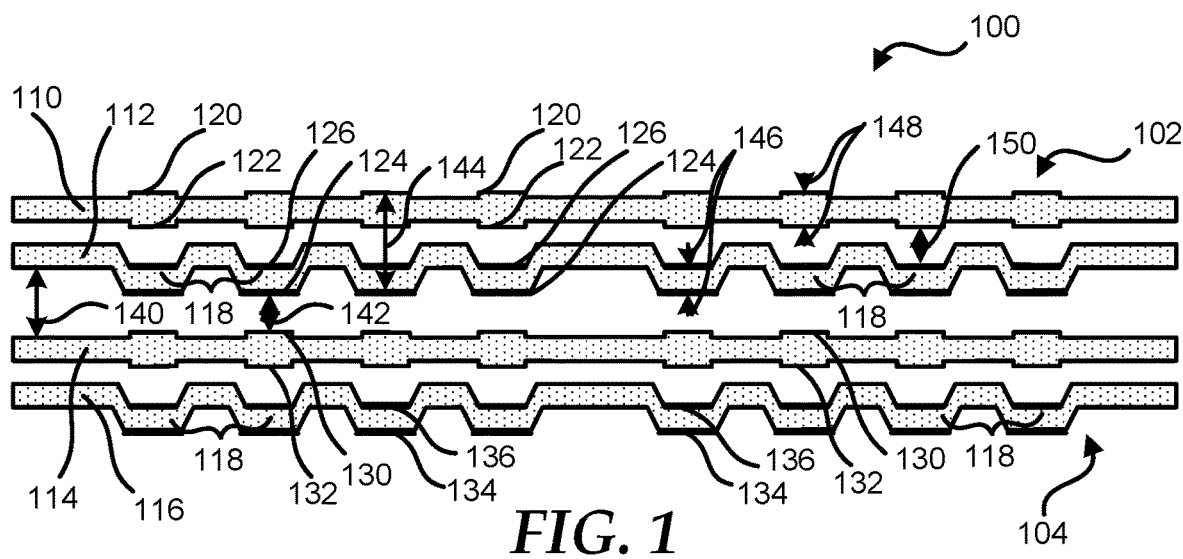
FIG. 1 is a diagram of differential pairs with dual-side impedance compensation according to prior art.
Figure 7:
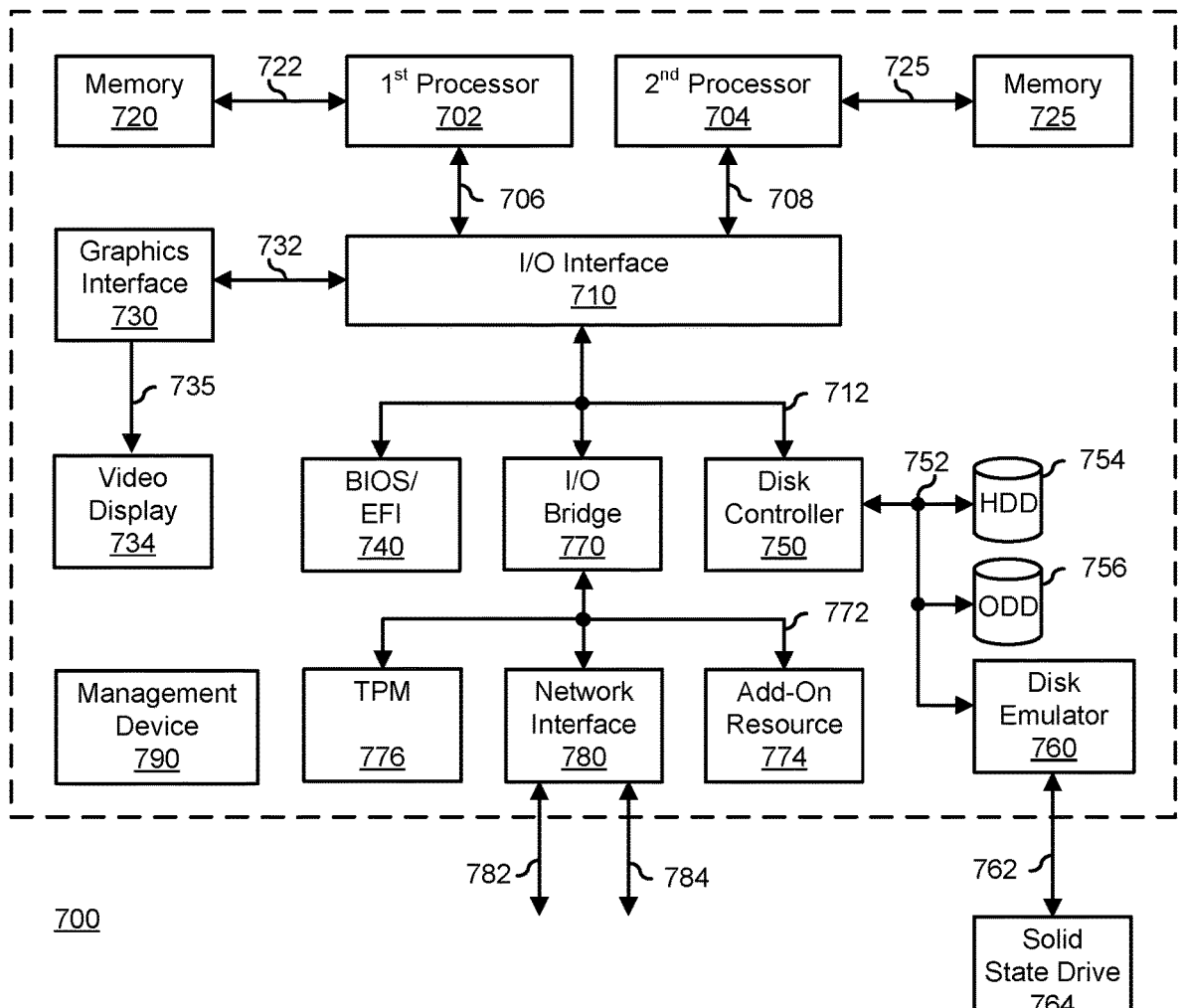
FIG. 7 is a block diagram of a general information handling system according to an embodiment of the present disclosure.

FIG. 1 illustrates a printed circuit board (PCB) 100 of an information handling system, such as information handling system 700 of FIG. 7, according to prior art in the field. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

PCB 100 includes differential pairs 102 and 104. Differential pair 102 includes traces 110 and 112, and differential pair 104 includes traces 114 and 116. Trace 110 of differential pair 102 and trace 114 of differential pair 104 may be substantially straight based on routing requirements within a ball grid array (BGA) pin field. However, spacing or room within the BGA pin field may be limited. In this situation, a high-speed differential signal transmitted along traces 110 and 112 of differential pair 102 and a high-speed differential signal transmitted along traces 114 and 116 of differential pair 104 may both have a dynamic phase matching requirement to improve signal transmission quality along the differential pair. Based on the phase matching requirement, trace 112 of differential pair 102 and trace 116 of differential pair 104 may include phase tuning bumping areas 118 to provide phase skew tuning within the respective differential pair. Signal integrity of high-speed signals transmitted along differential pairs 102 and 104 may be improved via other compensation schemes, such as impedance compensation, beyond the phase skew tuning described above.

Impedance compensation along differential pairs 102 and 104 of PCB 100 may be implemented by increasing the differential pair trace width in the phase tuning area of the differential pairs. As shown in FIG. 1, the width of trace 110 of differential pair 102 is increased by both an outer-side compensation 120 and an inner-side compensation 122 in the phase tuning area of the differential pair 102. As used herein, outer-side compensation refers to a side of a trace furthest from the other trace of the differential pair, and inner-side compensation refers to a side of a trace nearest to the other trace of the differential pair. For clarity, only a few outer-side compensations 120 and a few inner-side compensations 122 have been labeled. However, one of ordinary skill in the art will recognize trace 110 may include outer-side compensations 120 and inner-side compensations 122 at each of the phase tuning areas of differential pair 102.

As described above with respect to trace 110, the width of trace 112 of differential pair 102 is increased by an outer-side compensation 124 and an inner-side compensation 126 in the phase tuning bumping area 118. For clarity, only a few outer-side compensations 124 and a few inner-side compensations 126 have been labeled. However, one of ordinary skill in the art will recognize trace 112 may include outer-side compensation 124 and inner-side compensation 126 at each of the phase tuning bumping areas 118 of differential pair 102. The combination of outer-side and inner-side compensation may reduce return loss within differential pair 102.

As shown in FIG. 1, the width of trace 114 of differential pair 104 is increased by both an outer-side compensation 130 and an inner-side compensation 132 in the phase tuning area of the differential pair 104. For clarity, only a few outer-side compensations 130 and a few inner-side compensations 132 have been labeled. However, one of ordinary skill in the art will recognize trace 114 may include outer-side compensation 130 and inner-side compensation 132 at each of the phase tuning areas of differential pair 104.

As described above with respect to trace 114, the width of trace 116 of differential pair 104 is increased by an outer-side compensation 134 and an inner-side compensation 136 in the phase tuning bumping area 118. For clarity, only a few outer-side compensations 134 and a few inner-side compensations 136 have been labeled. However, one of ordinary skill in the art will recognize trace 116 may include outer-side compensation 134 and inner-side compensation 136 at each of the phase tuning bumping areas 118 of differential pair 104. The combination of outer-side and inner-side compensation may reduce return loss within differential pair 104.

Crosstalk between the differential signal on differential pair 102 and the differential signal on differential pair 104 may be created or changed by any suitable structural characteristic of the differential pairs on PCB 100. One such structural characteristic is a distance between differential pairs 102 and 104. As shown in FIG. 1, there are two different distances 140 and 142 between differential pairs 102 and 104. Distance 140 is the largest distance between trace 112 of differential pair 102 and trace 114 of differential pair 104, and this distance may be located at any point or location other than phase tuning bumping area 118 of trace 112. Distance 140 may be any suitable distance including, but not limited to, thirteen and eight-hundredths mils. Distance 142 is the smallest distance between trace 112 of differential pair 102 and trace 114 of differential pair 104, and this distance may be located within phase tuning bumping area 118 of trace 112. In particular, distance 142 is the distance between outer-side compensation 130 of trace 114 and outer-side compensation 124 on phase tuning bumping area 118 of trace 112. Distance 142 may be any suitable distance including, but not limited to, nine mils. One of ordinary skill in the art would recognize that mil is a unit of measurement utilized in routing on PCBs, and one mil equals one-thousandth of an inch or two hundred fifty four ten-thousandths of a millimeter.

In this situation, distance 142 may have the greatest impact on the crosstalk between differential pairs 102 and 104. Thus, while the combination of outer-side and inner-side compensations on traces 110, 112, 114, and 116 may reduce return loss within respective differential pairs 102 and 104, outer-side compensation 124 on trace 112 and outer-side compensation 130 of trace 114 may increase crosstalk between differential pairs 102 and 104. The width of outer-side compensation 124 on trace 112 and outer-side compensation 130 of trace 114 may reduce distance 142, which in turn may increase crosstalk between differential pairs 102 and 104.

Traces 110 and 112 of differential pair 102 and traces 114 and 116 of differential pair 104 have widths or spacings that may be substantially similar between the differential pairs. For clarity and brevity the widths and spacings will be described with respect to traces 110 and 112 of differential pair 102. Traces 110 and 112 may have an edge-to-edge width 144, compensation widths 146 and 148, and compensation spacing 150. Edge-to-edge width 144 may be the distance from an outermost edge of outer-side compensation 120 of trace 110 to an outermost edge of outer-side compensation 124 of trace 112. Thus, edge-to-edge width 144 may vary based on the widths of outer-side compensations 120 and 124. Edge-to-edge width 244 may be any suitable distance including, but not limited to, fifteen and eight-hundredths mils.

Compensation width 146 is the width of trace 112 plus the width of outer-side compensation 134 and inner-side compensation 136. Thus compensation width 146 may vary based on different widths of outer-side compensation 134 and inner-side compensation 136. As shown in FIG. 1, compensation width 146 may be measured or determined at phase tuning bumping area 118 of trace 112. Compensation width 148 is the width of trace 110 plus the width of outer-side compensation 120 and inner-side compensation 122, and compensation width 148 may be measured or determined at phase tuning bumping area of trace 110. Thus compensation width 148 may vary based on different widths of outer-side compensation 120 and inner-side compensation 122. In differential pairs 102 and 104 on PCB 100, compensation widths 146 and 148 may be the same width, such as four and six-tenths mils. However, in different layouts of differential pairs 102 and 104, compensation widths 146 and 148 may be different widths.

Compensation spacing 150 is the width between inner-side compensation 122 of trace 110 and inner-side compensation 126 of trace 112. Thus compensation spacing 150 may vary based on different widths of inner-side compensation 122 and inner-side compensation 126. Compensation spacing 150 may be any suitable distance between inner-side compensation 122 of trace 110 and inner-side compensation 126 of trace 112, such as six and six-tenths mils.

As stated above, while the combination of outer-side and inner-side compensations on traces 110, 112, 114, and 116 may reduce return loss within respective differential pair 104, outer-side compensation 124 on trace 112 and outer-side compensation 130 of trace 114 may increase crosstalk between differential pairs 102 and 104. The width of outer-side compensation 124 on trace 112 and outer-side compensation 130 of trace 114 may reduce distance 142, which in turn may increase crosstalk between differential pairs 102 and 104.

The inventor of the current disclosure have found an impedance compensation scheme that can keep the same impedance characteristics and return loss performance as compared to differential pairs 102 and 104, but may improve crosstalk performance as will be described with respect to FIG. 2 below.

Figure 2:
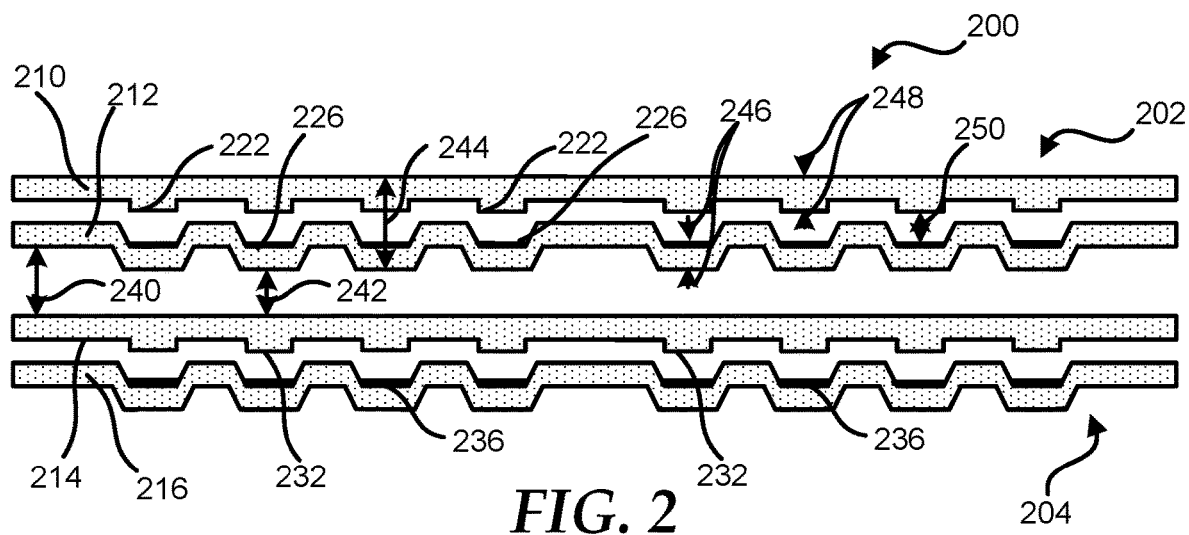
FIG. 2 is a diagram of differential pairs with inner-side impedance compensation according to at least one embodiment of the present disclosure.

FIG. 2 illustrates a PCB 200 including differential pairs 202 and 204 according to at least one embodiment of the present disclosure. Differential pair 202 includes traces 210 and 212, and differential pair 204 includes traces 214 and 216. Traces 210, 212, 214, and 216 may be understood to represent a signal traces that carry data signals between components of an information handling system, such as information handling system 700 of FIG. 7, and may include portions that are routed on a top or bottom surface of PCB 200, within one or more layers of the PCB, and within one or more vias between layers of the PCB, as needed or desired. While differential pair set 102 and 104 and differential pair set 202 and 204 are illustrated in separate figures, one of ordinary skill in the art would recognize that both differential pair sets may be routed on the same PCB without varying from the scope of this disclosure.

Trace 210 of differential pair 202 and trace 214 of differential pair 204 may be substantially straight based on routing requirements within a BGA pin field. However, spacing or room within the BGA field may be limited. In this situation, a high-speed differential signal transmitted along traces 210 and 212 of differential pair 202 and a high-speed differential signal transmitted along traces 214 and 216 of differential pair 204 may both have a dynamic phase matching requirement to improve signal transmission quality along the differential pair. Based on the phase matching requirement, trace 212 of differential pair 202 and trace 216 of differential pair 204 may include phase tuning bumping areas 218 to provide phase skew tuning within the respective differential pair. Signal integrity of high-speed signals transmitted along differential pairs 202 and 204 may be improved via other compensation schemes, such as impedance compensation, beyond the phase skew tuning described above.

Impedance compensation along differential pairs 202 and 204 of PCB 200 may be implemented by increasing the differential pair trace width in the phase tuning area of the differential pairs. As shown in FIG. 2, the width of trace 210 of differential pair 202 may be increased only by inner-side compensation 222 in the phase tuning area of the differential pair 202. In an example, the width of inner-side compensation 222 of trace 210 may be larger than the width of inner-side compensation 122 of trace 110 to provide a similar impedance compensation for trace 210 as compared to trace 110 of FIG. 1. In certain examples, the increase width of inner-side compensation 222 as compared to inner-side compensation 122 may be any suitable amount up to the combined widths of outer-side compensation 120 and inner-side compensation 122 of trace 110 of FIG. 1. For clarity, only a few inner-side compensations 222 have been labeled. However, one of ordinary skill in the art will recognize trace 210 may include inner-side compensations 222 at each of the phase tuning areas of differential pair 202.

As described above with respect to trace 210, the width of trace 212 of differential pair 202 may be increased only by inner-side compensation 226 in the phase tuning bumping area 218. In an example, the width of inner-side compensation 226 of trace 212 may be larger than the width of inner-side compensation 126 of trace 112 to provide a similar impedance compensation for trace 212 as compared to trace 112 of FIG. 1. In certain examples, the increase width of inner-side compensation 226 as compared to inner-side compensation 126 may be any suitable amount up to the combined widths of outer-side compensation 124 and inner-side compensation 126 of trace 112 of FIG. 1. For clarity, only a few inner-side compensations 226 have been labeled. However, one of ordinary skill in the art will recognize trace 212 may include inner-side compensations 226 at each of the phase tuning bumping areas 218 of differential pair 202. Inner-side compensation 222 of trace 210 and inner-side compensation 226 of trace 212 may reduce return loss within differential pair 202. In certain examples, the widths of inner-side compensations 222 and 226 may vary depending on a desired impedance compensation for differential pair 202. For example, lesser impedance compensation may be provided if the widths of inner-side compensations 222 and 226 are reduced, and greater impedance compensation may be provided if the widths of inner-side compensations 222 and 226 are increased.

Figure 3:
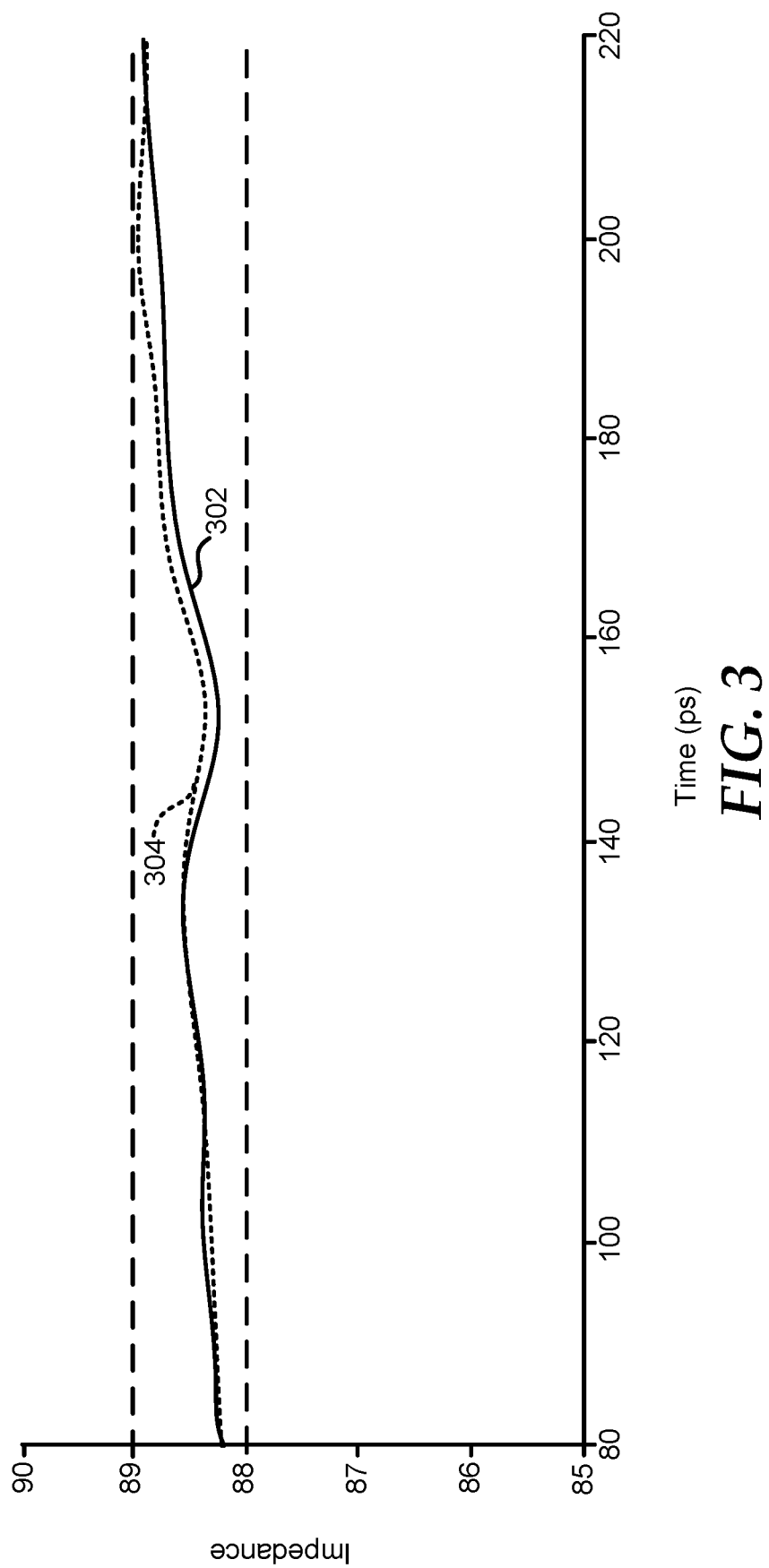
FIG. 3 is two impedance curves and each impedance curve is associated with the impedance of different respective differential pairs based a different impedance compensation scheme according to at least one embodiment of the present disclosure.

As stated above, inner-side compensations 222 of trace 210 and inner-side compensations 226 of trace 212 may maintain a substantially similar impedance compensation for differential pair 202 as compared to differential pair 102 as will be illustrated and described with respect to FIGS. 3.

FIG. 3 illustrates two impedance curves 302 and 304 and each impedance curve is associated with the impedance of different respective differential pairs, such as differential pair 102 of FIG. 1 and differential pair 202 of FIG. 2, based a different impedance compensation scheme according to at least one embodiment of the present disclosure. As shown in FIG. 3, the vertical axis indicates an impedance of a differential pair and the horizontal axis indicates an amount of time measured in picoseconds. In an example, the impedance compensation for a differential pair may be utilized to maintain an impedance variation for the traces of the differential pair to within a one ohm variation, such as between eighty-eight ohms and eighty-nine ohms as illustrated in FIG. 3.

Impedance curve 302 may be associated with either differential pair 102 or 104 of FIG. 1. Impedance curve 302 may be controlled based on the impedance compensations added to the traces of a particular differential pair. As stated above, impedance compensation along differential pairs 102 and 104 of PCB 100 may be implemented by increasing the differential pair trace width in the phase tuning area of the differential pairs. As shown in FIG. 1, the width of trace 110 of differential pair 102 is increased by both outer-side compensation 120 and inner-side compensation 122 in the phase tuning area of the differential pair 102. Similarly, the width of trace 112 of differential pair 102 is increased by both outer-side compensation 124 and inner-side compensation 126 in the phase tuning area of the differential pair 102. Thus outer-side compensations 120 and 124 and inner-side compensations 122 and 126 within differential pair 102 may cause the differential pair to have impedance curve 302 and an impedance variation less than a one ohm limited as shown in FIG. 3.

Impedance curve 304 may be associated with either differential pair 202 or 204 of FIG. 2. Impedance curve 304 may be controlled based on the impedance compensations added to the traces of a particular differential pair. As stated above, impedance compensation along differential pairs 202 and 204 of PCB 200 may be implemented by increasing the differential pair trace width in the phase tuning area of the differential pairs. As shown in FIG. 2, the width of trace 210 of differential pair 202 is increased by only inner-side compensation 222 in the phase tuning area of the differential pair 202. Similarly, the width of trace 212 of differential pair 202 is increased by only by inner-side compensation 226 in the phase tuning area of the differential pair 202. Thus inner-side compensations 222 and 226 within differential pair 202 may cause the differential pair to have impedance curve 304 and an impedance variation less than a one ohm limited as shown in FIG. 3.

Figure 4:
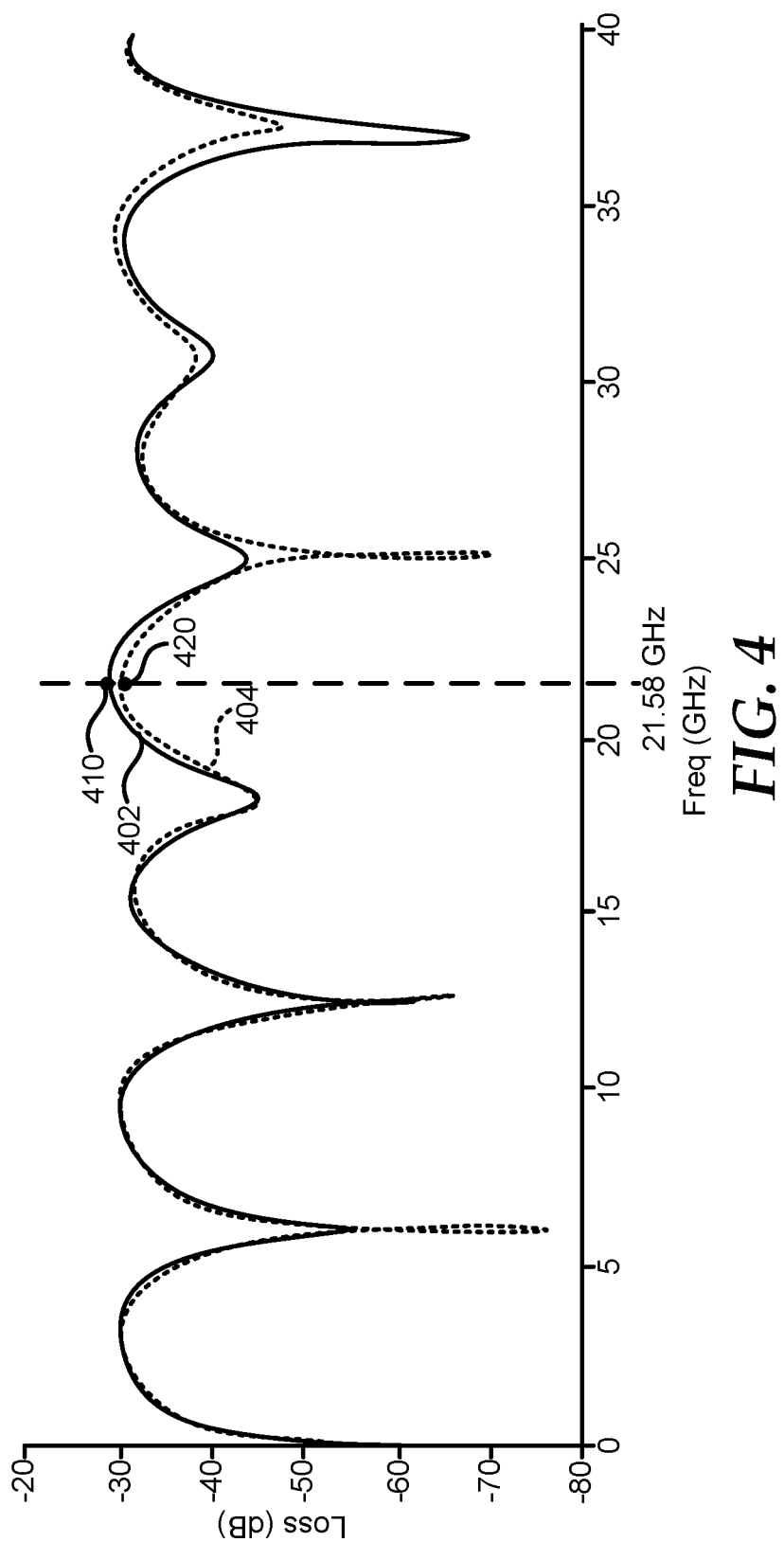
FIG. 4 is two return loss curves and each return loss curve is associated with the return loss of a different respective differential pair based on different impedance compensation schemes according to at least one embodiment of the present disclosure.

Referring back to FIG. 2, inner-side compensations 222 of trace 210 and inner-side compensations 226 of trace 212 may maintain a substantially similar return loss for differential pair 202 as compared to differential pair 102 as will be illustrated and described with respect to FIGS. 4.

FIG. 4 illustrates two return loss curves 402 and 404 and each return loss curve is associated with the return loss of a different respective differential pair, such as differential pair 102 of FIG. 1 and differential pair 202 of FIG. 2, based on the different impedance compensation schemes of FIGS. 1 and 2 according to at least one embodiment of the present disclosure. As shown in FIG. 4, the vertical axis indicates an amount of return loss and the horizontal axis indicates a frequency in Gigahertz (GHz). In an example, the impedance compensation for a differential pair may be utilized to maintain a particular return loss for the differential pair at a given frequency.

Return loss curve 402 may be associated with either differential pair 102 or 104 of FIG. 1. Return loss curve 402 may be controlled based on the impedance compensations added to the traces of a particular differential pair. As stated above, impedance compensation along differential pairs 102 and 104 of PCB 100 may be implemented by increasing the differential pair trace width in the phase tuning area of the differential pairs. As shown in FIG. 1, the width of trace 110 of differential pair 102 is increased by both outer-side compensation 120 and inner-side compensation 122 in the phase tuning area of the differential pair 102. Similarly, the width of trace 112 of differential pair 102 is increased by both outer-side compensation 124 and inner-side compensation 126 in the phase tuning area of the differential pair 102. Thus outer-side compensations 120 and 124 and inner-side compensations 122 and 126 within differential pair 102 may cause the differential pair to have return loss curve 402 with a particular return loss at a given frequency, such as a return loss substantially equal to −30 dB at 21.58 GHz as indicated by point 410 in FIG. 4.

Return loss curve 404 may be associated with either differential pair 202 or 204 of FIG. 2. Return loss curve 404 may be controlled based on the impedance compensations added to the traces of a particular differential pair. As stated above, impedance compensation along differential pairs 202 and 204 of PCB 200 may be implemented by increasing the differential pair trace width in the phase tuning area of the differential pairs. As shown in FIG. 2, the width of trace 210 of differential pair 202 is increased by only inner-side compensation 222 in the phase tuning area of the differential pair 202. Similarly, the width of trace 212 of differential pair 202 is increased by only by inner-side compensation 226 in the phase tuning area of the differential pair 202. Thus inner-side compensations 222 and 226 within differential pair 202 may cause the differential pair to have return loss curve 402 with a return loss substantially equal to the return loss of point 510 at the same frequency of return loss curve 502, such as a return loss substantially equal to −30 dB at 21.58 GHz as indicated by point 420 in FIG. 4.

Referring back to FIG. 2, the width of trace 214 of differential pair 204 may be increased only by inner-side compensation 232 in the phase tuning area of the differential pair 204. In an example, the width of inner-side compensation 232 of trace 214 may be larger than the width of inner-side compensation 122 of trace 114 to provide a similar impedance compensation for trace 214 as compared to trace 114 of FIG. 1. In certain examples, the increase width of inner-side compensation 232 as compared to inner-side compensation 132 may be any suitable amount up to the combined widths of outer-side compensation 130 and inner-side compensation 132 of trace 114 of FIG. 1.

The width of trace 216 of differential pair 204 is increased only by inner-side compensation 236 in the phase tuning bumping area 218. In an example, the width of inner-side compensation 236 of trace 216 may be larger than the width of inner-side compensation 136 of trace 116 to provide a similar impedance compensation for trace 216 as compared to trace 116 of FIG. 1. The increase width of inner-side compensation 236 as compared to inner-side compensation 136 may be any suitable amount up to the combined widths of outer-side compensation 134 and inner-side compensation 136 of trace 116 of FIG. 1. For clarity, only a few inner-side compensations 232 and 236 have been labeled. However, one of ordinary skill in the art will recognize trace 214 may include inner-side compensations 232 at each of the phase tuning areas of differential pair 204 and trace 216 may include inner-side compensations 236 at each of the phase tuning bumping areas 218. Inner-side compensation 232 of trace 214 and inner-side compensation 236 of trace 216 may reduce return loss within differential pair 204. In certain examples, the widths of inner-side compensations 232 and 236 may vary depending on a desired impedance compensation for differential pair 204. For example, lesser impedance compensation may be provided if the widths of inner-side compensations 232 and 236 are reduced, and greater impedance compensation may be provided if the widths of inner-side compensations 232 and 236 are increased.

Crosstalk between the differential signal on differential pair 202 and the differential signal on differential pair 204 may be created or changed by any suitable structural characteristic of the differential pairs on PCB 200. One such structural characteristic is a distance between differential pairs 202 and 204. As shown in FIG. 2, there are two different distances 240 and 242 between differential pairs 202 and 204. Distance 240 is the largest distance between trace 212 of differential pair 202 and trace 214 of differential pair 204, and this distance may be located at any point or location other than phase tuning bumping area 218 of trace 212. Distance 240 may be any suitable distance including, but not limited to, thirteen and eight-hundredths mils. In this example, distance 240 between differential pairs 202 and 204 may be substantially equal to distance 140 between differential pairs 102 and 104 on PCB 100 of FIG. 1.

Distance 242 is the smallest distance between trace 212 of differential pair 202 and trace 214 of differential pair 204, and this distance may be located within phase tuning bumping area 218 of trace 212. In particular, distance 242 is the distance between an outer edge of trace 214 and an outer edge of phase tuning bumping area 218 of trace 212. In this example, the outer edges of traces 212 and 214 may be the edges of the traces themselves without an outer-side compensation trace being adding to the traces. Distance 242 may be any suitable distance including, but not limited to, ten mils. In this example, distance 240 between differential pairs 202 and 204 may be greater than distance 140 between differential pairs 102 and 104 on PCB 100 of FIG. 1.

In this situation, distance 242 may improve the far-end crosstalk (FEXT) performance of differential pairs 202 and 204 and compared to the crosstalk performance of differential pairs 102 and 204. In an example, the combination of inner-side compensations 222 and 226 on respective traces 210 and 212 may reduce return loss within differential pair 202. Similarly, the combination of inner-side compensations 232 and 236 on respective traces 214 and 216 may reduce return loss within differential pair 204. Additionally, based on traces 210, 212, 214, and 216 only including respective inner-side compensations 222, 226, 232, and 236, the FEXT between differential pairs 202 and 204 may be reduced. In this example, inner-side compensations 222, 226, 232, and 236 do not affect distance 242 between differential pairs 202 and 204, which in turn may reduce or suppress the FEXT between differential pairs 202 and 204 as compared to differential pairs 102 and 104 as will be illustrated and described with respect to FIG. 5.

Figure 5:
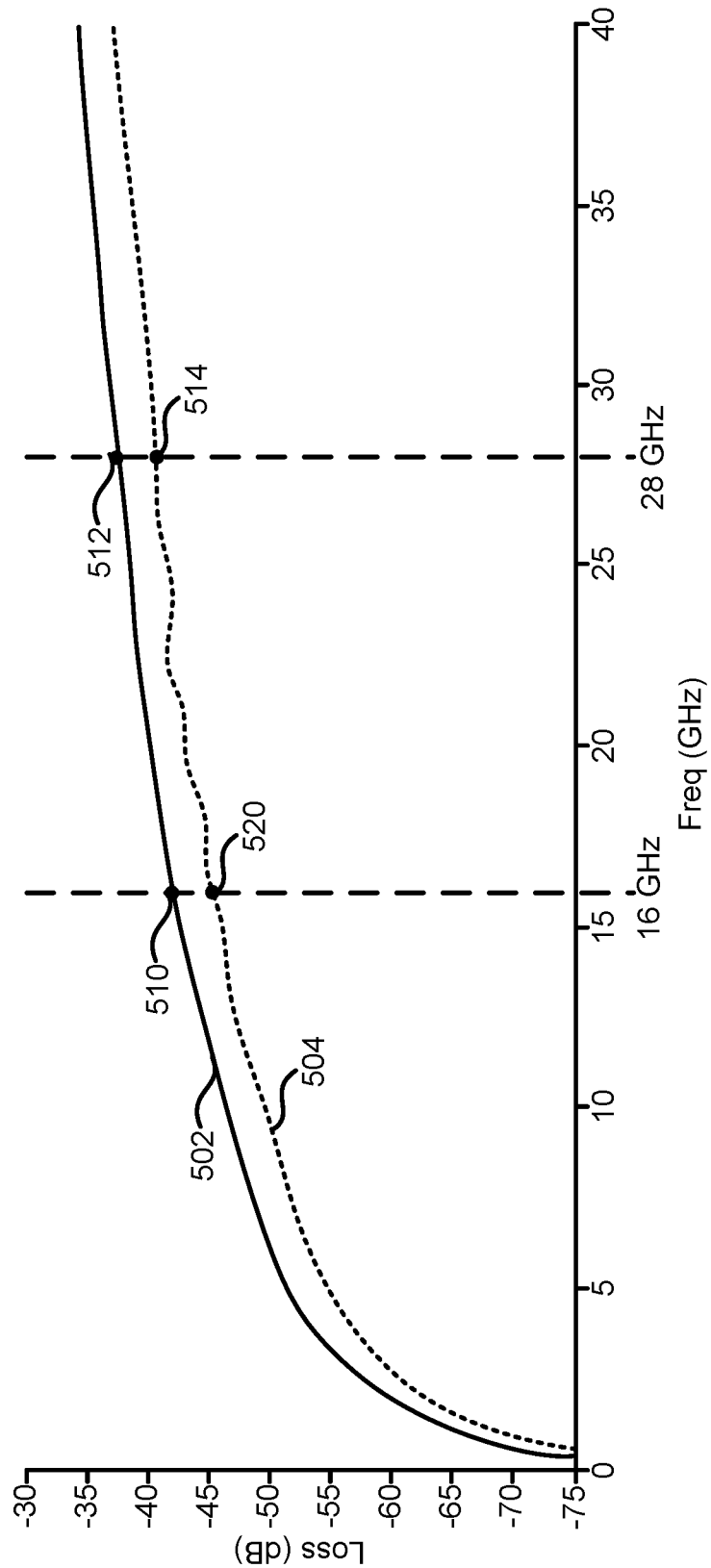
FIG. 5 is two crosstalk curves and each crosstalk curve is associated with the crosstalk between differential pairs based on different impedance compensation schemes according to at least one embodiment of the present disclosure.

FIG. 5 illustrates crosstalk curves 502 and 504 associated with the crosstalk between differential pairs based on different impedance compensation schemes according to at least one embodiment of the present disclosure. As shown in FIG. 4, the vertical axis indicates an amount of loss for crosstalk between differential pairs and the horizontal axis indicates a frequency in Gigahertz (GHz). In an example, the impedance compensation for a differential pair may affect crosstalk between the differential pair at a given frequency.

Crosstalk curve 502 may be associated with differential pairs 102 and 104 of FIG. 1. Crosstalk curve 502 may be affected based on the impedance compensations added to the traces of the differential pairs. As stated above, impedance compensation along differential pairs 102 and 104 of PCB 100 may be implemented by increasing the differential pair trace width in the phase tuning area of the differential pairs. As shown in FIG. 1, the width of trace 110 of differential pair 102 is increased by both outer-side compensation 120 and inner-side compensation 122 in the phase tuning area of the differential pair 102. Similarly, the width of trace 112 of differential pair 102 is increased by both outer-side compensation 124 and inner-side compensation 126 in the phase tuning area of the differential pair 102. Thus outer-side compensations 120 and 124 and inner-side compensations 122 and 126 within differential pair 102 may result in distance 142 between differential pairs 102 and 104.

Distance 142 may result in differential pairs 102 and 104 to have crosstalk curve 402 with a particular crosstalk at respective frequencies. Differential pairs 102 and 104 may be utilized to provide a high-speed signal, such as a signal at either 16 GHz or 28 GHz. Differential pairs 102 and 104 may have a power sum far-end crosstalk (PSFEXT) suppression substantially equal to −42 dB at 16 GHz as indicated by point 510 in FIG. 5. Similarly, differential pairs 102 and 104 may have a power sum far-end crosstalk (PSFEXT) suppression substantially equal to −38 dB at 28 GHz as indicated by point 512 in FIG. 5.

Crosstalk curve 504 may be associated with differential pairs 202 and 204 of FIG. 2. Crosstalk curve 504 may be affected based on the impedance compensations added to the traces of a particular differential pair. As stated above, impedance compensation along differential pairs 202 and 204 of PCB 200 may be implemented by increasing the differential pair trace width in the phase tuning area of the differential pairs. As shown in FIG. 2, the width of trace 210 of differential pair 202 is increased by only inner-side compensation 222 in the phase tuning area of the differential pair 202. Similarly, the width of trace 212 of differential pair 202 is increased by only by inner-side compensation 226 in the phase tuning area of the differential pair 202. Thus inner-side compensations 222 and 226 within differential pair 202 may result in distance 242 between differential pairs 202 and 204.

As stated above, distance 242 may be greater than distance 142 of differential pairs 102 and 104, such that the FEXT performance of differential pairs 202 and 204 may be improved as compared to differential pairs 102 and 104. In an example, distance 242 may result in differential pairs 202 and 204 to have crosstalk curve 504 with a particular FEXT at respective frequencies. Differential pairs 202 and 204 may be utilized to provide substantially similar high-speed signals as differential pairs 102 and 104. As shown in FIG. 5, crosstalk curve 504 has a greater PSFEXT loss or suppression for all frequencies of a signal as compared to crosstalk curve 502. For example, crosstalk curve 504 indicates that differential pairs 202 and 204 may have a PSFEXT suppression substantially equal to −45 dB at 16 GHz as indicated by point 520 in FIG. 5. This PSFEXT suppression may be substantially equal to a 3 dB PSFEXT suppression improvement for differential pairs 202 and 204 as compared to differential pairs 102 and 104. Similarly, differential pairs 202 and 204 may have a PSFEXT suppression substantially equal to −41 dB at 28 GHz as indicated by point 514 in FIG. 5. This PSFEXT suppression may be substantially equal to a 3 dB PSFEXT suppression improvement for differential pairs 202 and 204 as compared to differential pairs 102 and 104.

Traces 210 and 212 of differential pair 202 and traces 214 and 216 of differential pair 204 have widths or spacings that may be substantially similar between the differential pairs. For clarity and brevity the widths and spacings will be described with respect to traces 210 and 212 of differential pair 202. Traces 210 and 212 may have an edge-to-edge width 244, compensation widths 246 and 248, and compensation spacing 250. Edge-to-edge width 244 may be the distance from an outermost edge trace 210 to an outermost edge of trace 212. Thus, edge-to-edge width 244 may vary based on the widths of traces 210 and 212. Edge-to-edge width 244 may be any suitable distance including, but not limited to, fourteen and eight-hundredths mils. In an example, edge-to-edge width 244 of traces 210 and 212 and the edge-to-edge width of traces 214 and 214 may both be less than edge-to-edge width 144 of traces 110 and 112 and the edge-to-edge width of traces 114 and 116 of FIG. 1. In this example, traces 210 and 212 of differential pair 202 and traces 214 and 216 of differential pair 204 may consume or cover a smaller amount space on PCB 200 as compared to the amount of space that differential pairs 102 and 104 consume or cover on PCB 100 of FIGS. 1.

Compensation width 246 is the width of trace 212 plus the width of inner-side compensation 236. Thus compensation width 246 may vary based on different widths of inner-side compensation 236. As shown in FIG. 2, compensation width 246 may be measured or determined at phase tuning bumping area 218 of trace 212. Compensation width 248 is the width of trace 210 plus inner-side compensation 222, and compensation width 248 may be measured or determined at phase tuning bumping area of trace 210. Thus compensation width 248 may vary based on different widths of outer-side compensation 220 and inner-side compensation 222. In differential pairs 202 and 204 on PCB 200, compensation widths 246 and 248 may be the same width, such as four and four-tenths mils. However, in different layouts of differential pairs 202 and 204, compensation widths 246 and 248 may be different widths.

Compensation spacing 250 is the width between inner-side compensation 222 of trace 210 and inner-side compensation 226 of trace 212. Thus compensation spacing 250 may vary based on different widths of inner-side compensation 222 and inner-side compensation 226. Compensation spacing 250 may be any suitable distance between inner-side compensation 222 of trace 210 and inner-side compensation 226 of trace 212, such as six mils.

As stated above, inner-side compensations 222 of trace 210 and inner-side compensations 226 of trace 212 may maintain substantially similar impedance compensation and a substantially similar return loss for differential pair 202 as compared to differential pair 102. Similarly, inner-side compensations 232 of trace 214 and inner-side compensations 236 of trace 216 may maintain substantially similar impedance compensation and a substantially similar return loss for differential pair 204 as compared to differential pair 104. Additionally, traces 210, 212, 214, and 216 having only respective inner-side compensations 222, 226, 232, and 236 may improve the crosstalk performance for differential pairs 202 and 204 may be improved as compare to differential pairs 102 and 104 as will be illustrated and described with respect to FIG. 6.

Figure 6:
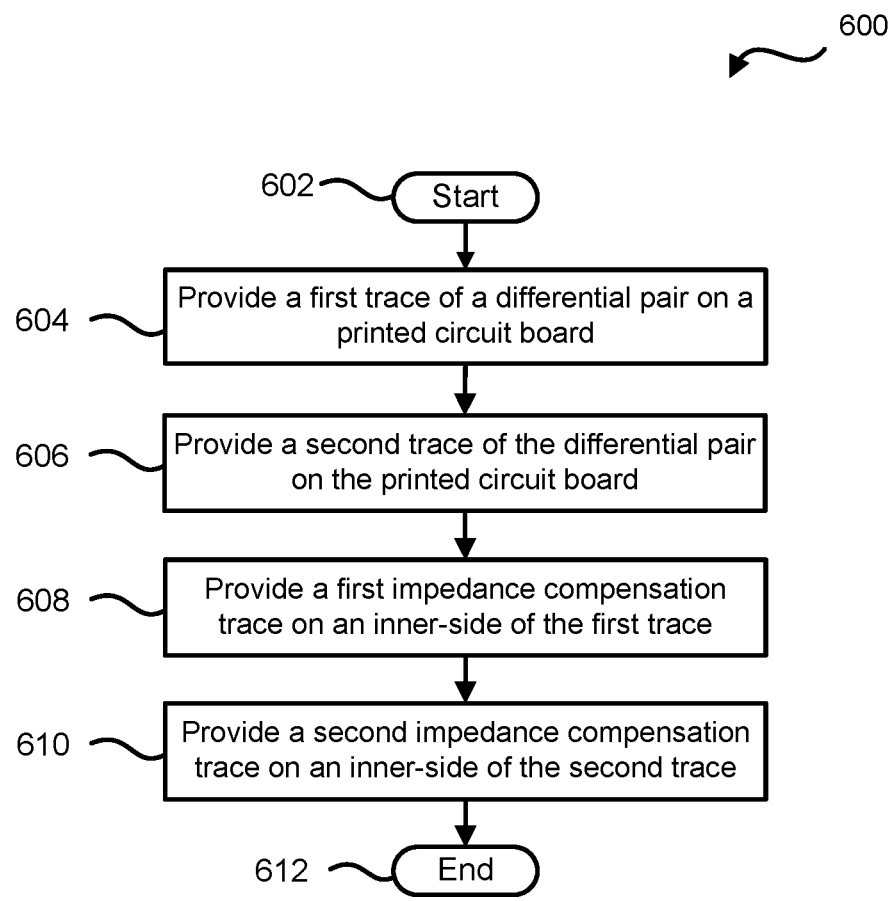
FIG. 6 is a flow diagram of method for implementing an inner-side impedance compensation scheme to a differential pair according to at least one embodiment of the present disclosure.

FIG. 6 is a flow diagram of method 600 for implementing an inner-side impedance compensation scheme to a differential pair according to at least one embodiment of the present disclosure, starting a block 602. It will be readily appreciated that not every method step set forth in this flow diagram is always necessary, and that certain steps of the methods may be combined, performed simultaneously, in a different order, or perhaps omitted, without varying from the scope of the disclosure. FIG. 6 may be employed in whole, or in part, any other type of controller, device, module, processor, or any combination thereof, operable to employ all, or portions of, the method of FIG. 6.

At block 604, a first trace of a differential pair is provided or routed on a PCB. In an example, the first trace may be any suitable length and may be provided in any suitable direction on the PCB. For example, the direction of the first trace on the PCB may be based on routing requirements within a BGA pin field of the PCB. At block 606, a second trace of the differential pair is provided or routed on a PCB. In an example, may be routed a particular distance from the first trace to create the differential pair of the first and second traces. In certain examples, spacing or room within the BGA pin field may be limited. In this situation, a high-speed differential signal transmitted along the first and second traces of the differential pair may have a dynamic phase matching requirement to improve signal transmission quality along the differential pair. Based on the phase matching requirement, the second trace of the differential pair may include phase tuning bumping areas to provide phase skew tuning within the respective differential pair.

At block 608, a first set of impedance compensation traces may be provided or routed on an inner-side of the first trace. In an example, the first impedance compensation traces may be located at any suitable locations along the first trace. For example, the first impedance compensation traces may be located on the inner-side of the first trace at the phase tuning bumping areas of the differential pair.

At block 610, a second set of impedance compensation traces may be provided or routed on an inner-side of the first trace, and the flow ends at block 612. In an example, the second impedance compensation traces may be located at any suitable locations along the second trace. For example, the second impedance compensation traces may be located on the inner-side of the phase tuning bumping areas on the second trace. In certain examples, the first and second impedance compensation traces may maintain a particular impedance and return loss along the first and second traces and may provide improved crosstalk performance between the differential pair and a nearby differential pair as compared to previous impedance compensation schemes.

FIG. 7 illustrates a generalized embodiment of an information handling system 700. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 700 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 700 can include processing resources for executing machine-executable code, such as a central processing unit (CPU), a programmable logic array (PLA), an embedded device such as a System-on-a-Chip (SoC), or other control logic hardware. Information handling system 700 can also include one or more computer-readable medium for storing machine-executable code, such as software or data. Additional components of information handling system 700 can include one or more storage devices that can store machine-executable code, one or more communications ports for communicating with external devices, and various input and output (I/O) devices, such as a keyboard, a mouse, and a video display. Information handling system 700 can also include one or more buses operable to transmit information between the various hardware components.

Information handling system 700 can include devices or modules that embody one or more of the devices or modules described below, and operates to perform one or more of the methods described below. Information handling system 700 includes a processors 702 and 704, an input/output (I/O) interface 710, memories 720 and 725, a graphics interface 730, a basic input and output system/universal extensible firmware interface (BIOS/UEFI) module 740, a disk controller 750, a hard disk drive (HDD) 754, an optical disk drive (ODD) 756, a disk emulator 760 connected to an external solid state drive (SSD) 762, an I/O bridge 770, one or more add-on resources 774, a trusted platform module (TPM) 776, a network interface 780, a management device 790, and a power supply 795. Processors 702 and 704, I/O interface 710, memory 720, graphics interface 730, BIOS/UEFI module 740, disk controller 750, HDD 754, ODD 756, disk emulator 760, SSD 762, I/O bridge 770, add-on resources 774, TPM 776, and network interface 780 operate together to provide a host environment of information handling system 700 that operates to provide the data processing functionality of the information handling system. The host environment operates to execute machine-executable code, including platform BIOS/UEFI code, device firmware, operating system code, applications, programs, and the like, to perform the data processing tasks associated with information handling system 700.

In the host environment, processor 702 is connected to I/O interface 710 via processor interface 706, and processor 704 is connected to the I/O interface via processor interface 708. Memory 720 is connected to processor 702 via a memory interface 722. Memory 725 is connected to processor 704 via a memory interface 727. Graphics interface 730 is connected to I/O interface 710 via a graphics interface 732, and provides a video display output 736 to a video display 734. In a particular embodiment, information handling system 700 includes separate memories that are dedicated to each of processors 702 and 704 via separate memory interfaces. An example of memories 720 and 730 include random access memory (RAM) such as static RAM (SRAM), dynamic RAM (DRAM), non-volatile RAM (NV-RAM), or the like, read only memory (ROM), another type of memory, or a combination thereof. BIOS/UEFI module 740, disk controller 750, and I/O bridge 770 are connected to I/O interface 710 via an I/O channel 712. An example of I/O channel 712 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 710 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 740 includes BIOS/UEFI code operable to detect resources within information handling system 700, to provide drivers for the resources, initialize the resources, and access the resources. BIOS/UEFI module 740 includes code that operates to detect resources within information handling system 700, to provide drivers for the resources, to initialize the resources, and to access the resources.

Disk controller 750 includes a disk interface 752 that connects the disk controller to HDD 754, to ODD 756, and to disk emulator 760. An example of disk interface 752 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 760 permits SSD 764 to be connected to information handling system 700 via an external interface 762. An example of external interface 762 includes a USB interface, an IEEE 1394 (Firewire) interface, a proprietary interface, or a combination thereof. Alternatively, solid-state drive 764 can be disposed within information handling system 700.

I/O bridge 770 includes a peripheral interface 772 that connects the I/O bridge to add-on resource 774, to TPM 776, and to network interface 780. Peripheral interface 772 can be the same type of interface as I/O channel 712, or can be a different type of interface. As such, I/O bridge 770 extends the capacity of I/O channel 712 when peripheral interface 772 and the I/O channel are of the same type, and the I/O bridge translates information from a format suitable to the I/O channel to a format suitable to the peripheral channel 772 when they are of a different type. Add-on resource 774 can include a data storage system, an additional graphics interface, a network interface card (NIC), a sound/video processing card, another add-on resource, or a combination thereof. Add-on resource 774 can be on a main circuit board, on separate circuit board or add-in card disposed within information handling system 700, a device that is external to the information handling system, or a combination thereof.

Network interface 780 represents a NIC disposed within information handling system 700, on a main circuit board of the information handling system, integrated onto another component such as I/O interface 710, in another suitable location, or a combination thereof. Network interface device 780 includes network channels 782 and 784 that provide interfaces to devices that are external to information handling system 700. In a particular embodiment, network channels 782 and 784 are of a different type than peripheral channel 772 and network interface 780 translates information from a format suitable to the peripheral channel to a format suitable to external devices. An example of network channels 782 and 784 includes InfiniBand channels, Fibre Channel channels, Gigabit Ethernet channels, proprietary channel architectures, or a combination thereof. Network channels 782 and 784 can be connected to external network resources (not illustrated). The network resource can include another information handling system, a data storage system, another network, a grid management system, another suitable resource, or a combination thereof.

Management device 790 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 700. In particular, management device 790 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 700, such as system cooling fans and power supplies. Management device 790 can include a network connection to an external management system, and the management device can communicate with the management system to report status information for information handling system 700, to receive BIOS/UEFI or system firmware updates, or to perform other task for managing and controlling the operation of information handling system 700. Management device 790 can operate off of a separate power plane from the components of the host environment so that the management device receives power to manage information handling system 700 when the information handling system is otherwise shut down. An example of management device 790 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like.

Management device 790 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system comprising:
a first differential pair on a printed circuit board of the information handling system, wherein the first differential pair includes:
first and second traces;
a first set of impedance compensations routed only on an inner-side of the first trace, wherein a first width of the first trace is increased at locations of each of the first impedance compensations; and
a second set of impedance compensations routed only on an inner-side of the second trace, wherein a second width of the second trace is increased at locations of each of the second impedance compensations, wherein the first and second impedance compensations are substantially aligned;
a second differential pair on the printed circuit board, the second differential pair includes third and fourth traces, wherein a first distance separates the first and second differential pairs based on a distance between an outer-edge of the second trace at phase tuning bumping areas of the first differential pair and an outer-edge of the third trace at phase tuning bumping areas of the second differential pair;
a third differential pair on the printed circuit board, the third differential pair includes fifth and sixth traces; and
a fourth differential pair on the printed circuit board, the fourth differential pair includes seventh and eighth traces, wherein a second distance separates the third and fourth differential pair based on a distance between an outer-edge of the sixth trace at the phase tuning bumping areas of the third differential pair and an outer-edge of the seventh trace at the phase tuning bumping areas of the fourth differential pair, wherein the first distance is greater than the second distance.

2. The information handling system of claim 1, wherein the second differential pair includes:
a third set of impedance compensations routed only on an inner-side of the third trace; and
a fourth set of impedance compensations routed only on an inner-side of the fourth trace, wherein the third and fourth impedance compensations are substantially aligned.

3. The information handling system of claim 1, wherein the first distance affects a crosstalk performance of the first and second differential pairs.

4. The information handling system of claim 1, wherein the third differential pair includes:
a fifth set of impedance compensations routed on an inner-side of the fifth trace;
a sixth set of impedance compensations routed on an outer-side of the fifth trace, wherein the fifth and sixth impedance compensation are substantially aligned;
a seventh set of impedance compensations routed on an inner-side of the sixth trace; and
an eighth set of impedance compensations routed on an outer-side of the sixth trace, wherein the seventh and eighth impedance compensation are substantially aligned;
wherein the fourth differential pair includes:
a ninth set of impedance compensations routed on an inner-side of the seventh trace;
a tenth set of impedance compensations routed on an outer-side of the seventh trace, wherein the ninth and tenth impedance compensations are substantially aligned;
an eleventh set of impedance compensations routed on an inner-side of the eighth trace; and
a twelfth set of impedance compensations routed on an outer-side of the eighth trace, wherein the eleventh and twelfth impedance compensations are substantially aligned.

5. The information handling system of claim 1, wherein based on the first distance being greater than the second distance, the first and second differential pairs have a greater crosstalk suppression as compared to the third and fourth differential pairs.

6. The information handling system of claim 1, wherein the first and second differential pairs have a substantially equal impedance compensation as compared to the third and fourth differential pairs.

7. An information handling system comprising:
a first differential pair on a printed circuit board of the information handling system, wherein the first differential pair includes:
first and second traces;
a first set of impedance compensations routed only on an inner-side of the first trace, wherein the first impedance compensations are located on the inner-side of the first trace at phase tuning bumping areas of the first differential pair, wherein a first width of the first trace is increased at locations of each of the first impedance compensations; and
a second set of impedance compensations routed only on an inner-side of the second trace, wherein the second impedance compensations are located on the inner-side of the second trace at the phase tuning bumping areas of the first differential pair, wherein a second width of the second trace is increased at locations of each of the second impedance compensations, wherein the first and second impedance compensations are substantially aligned; and
a second differential pair on the printed circuit board, wherein the second differential pair includes:
third and fourth traces;
a third set of impedance compensations routed only on an inner-side of the third trace wherein the third impedance compensations are located on the inner-side of the third trace at phase tuning bumping areas of the second differential pair; and
a fourth set of impedance compensations routed only on an inner-side of the fourth trace, wherein the fourth impedance compensations are located on the inner-side of the fourth trace at the phase tuning bumping areas of the second differential pair, wherein the third and fourth impedance compensations are substantially aligned, wherein a first distance separates the first and second differential pairs based on a distance between an outer-edge of the second trace at phase tuning bumping areas of the first differential pair and an outer-edge of the third trace at phase tuning bumping areas of the second differential pair;
a third differential pair on the printed circuit board, the third differential pair includes fifth and sixth traces; and
a fourth differential pair on the printed circuit board, the fourth differential pair includes seventh and eighth traces, wherein a second distance separates the third and fourth differential pair based on a distance between an outer-edge of the sixth trace at the phase tuning bumping areas of the third differential pair and an outer-edge of the seventh trace at the phase tuning bumping areas of the fourth differential pair, wherein the first distance is greater than the second distance.

8. The information handling system of claim 7, wherein the first distance affects a crosstalk performance of the first and second differential pairs.

9. The information handling system of claim 7, wherein the third differential pair includes:
a fifth set of impedance compensations routed on an inner-side of the fifth trace;
a sixth set of impedance compensations routed on an outer-side of the fifth trace, wherein the fifth and sixth impedance compensations are substantially aligned;
a seventh set of impedance compensations routed on an inner-side of the sixth trace; and
an eighth set of impedance compensations routed on an outer-side of the sixth trace, wherein the seventh and eighth impedance compensations are substantially aligned;
wherein the fourth differential pair includes:
seventh and eighth traces;
a ninth set of impedance compensations routed on an inner-side of the seventh trace;
a tenth set of impedance compensations routed on an outer-side of the seventh trace, wherein the ninth and tenth impedance compensations are substantially aligned;
an eleventh set of impedance compensations routed on an inner-side of the eighth trace; and
a twelfth set of impedance compensations routed on an outer-side of the eighth trace, wherein the eleventh and twelfth impedance compensations are substantially aligned.

10. The information handling system of claim 7, wherein based on the first distance being greater than the second distance, the first and second differential pairs have a greater crosstalk suppression as compared to the third and fourth differential pairs.

11. The information handling system of claim 7, wherein the first and second differential pairs have a substantially equal impedance compensation as compared to the third and fourth differential pairs.

12. A method comprising:
routing a first trace of a first differential pair on a printed circuit board of an information handling system;
routing a second trace of the first differential pair on the printed circuit board of the information handling system;
routing a first set of impedance compensations along the first trace, wherein the first impedance compensations are routed only on an inner-side of the first trace, wherein a first width of the first trace is increased at locations of each of the first impedance compensations;
routing a second set of impedance compensations along the second trace, wherein the second impedance compensations are routed only on an inner-side of the second trace, wherein a second width of the second trace is increased at locations of each of the second impedance compensations;
routing a third trace and a fourth trace of a second differential pair on a printed circuit board of an information handling system, wherein a first distance separates the first and second differential pairs based on a distance between an outer-edge of the second trace at phase tuning bumping areas of the first differential pair and an outer-edge of the third trace at phase tuning bumping areas of the second differential pair;
routing a fifth trace and a sixth trace of a third differential pair on a printed circuit board of an information handling system; and
routing a seventh trace and an eighth of a fourth differential pair on a printed circuit board of an information handling system, wherein a second distance separates the third and fourth differential pair based on a distance between an outer-edge of the sixth trace at the phase tuning bumping areas of the third differential pair and an outer-edge of the seventh trace at the phase tuning bumping areas of the fourth differential pair, wherein the first distance is greater than the second distance.

13. The method of claim 12, wherein the first impedance compensations are located on the inner-side of the first trace at phase tuning bumping areas of the first differential pair, and the second impedance compensations are located on the inner-side of the second trace at the phase tuning bumping areas of the first differential pair.

14. The method of claim 12, wherein based on the first distance being greater than the second distance, the first and second differential pairs have a greater crosstalk suppression as compared to the third and fourth differential pairs.

15. The method of claim 12, wherein the first and second differential pairs have a substantially equal impedance compensation as compared to the third and fourth differential pairs.

16. The method of claim 12, the first distance affects a crosstalk performance of the first and second differential pairs.

17. The method of claim 12, the second distance affects a crosstalk performance of the third and fourth differential pairs.

* * * * *